United States Patent
Ehlen

(10) Patent No.: US 8,604,981 B2
(45) Date of Patent: Dec. 10, 2013

(54) PANEL ANTENNA AND METHOD OF FORMING A PANEL ANTENNA

(75) Inventor: Mathias Martin Ernest Ehlen, Upper Hutt (NZ)

(73) Assignee: Times-7 Holdings Limited, Mahora, Hastings (NZ)

( * ) Notice: Subject to any disclaimer, the term of this patent is extended or adjusted under 35 U.S.C. 154(b) by 639 days.

(21) Appl. No.: 12/669,554

(22) PCT Filed: Jul. 17, 2008

(86) PCT No.: PCT/NZ2008/000171
§ 371 (c)(1),
(2), (4) Date: Jul. 28, 2010

(87) PCT Pub. No.: WO2009/011601
PCT Pub. Date: Jan. 22, 2009

(65) Prior Publication Data
US 2010/0283687 A1    Nov. 11, 2010

(30) Foreign Application Priority Data

Jul. 18, 2007    (NZ) .................................... 556602
Mar. 7, 2008    (NZ) .................................... 566529

(51) Int. Cl.
*H01Q 1/38*    (2006.01)
(52) U.S. Cl.
USPC ............... 343/700 MS; 343/848; 343/767
(58) Field of Classification Search
USPC ......... 343/700 MS, 767, 846, 848, 702, 770, 343/909, 756
See application file for complete search history.

(56) References Cited

U.S. PATENT DOCUMENTS

| | | | |
|---|---|---|---|
| 4,371,877 A | | 2/1983 | Doussot et al. |
| 4,682,180 A | * | 7/1987 | Gans ............................ 343/769 |
| 6,326,920 B1 | | 12/2001 | Barnett et al. |
| 6,498,587 B1 | * | 12/2002 | Desclos et al. ......... 343/700 MS |
| 6,539,608 B2 | * | 4/2003 | McKinnon et al. ............. 29/600 |
| 6,778,141 B1 | * | 8/2004 | Yeh ......................... 343/700 MS |
| 7,064,713 B2 | * | 6/2006 | Koenig ................... 343/700 MS |
| 7,167,129 B1 | * | 1/2007 | Strassner, II ........... 343/700 MS |
| 2002/0000944 A1 | | 1/2002 | Sabet et al. |
| 2002/0180642 A1 | | 12/2002 | Frecska |
| 2005/0146479 A1 | | 7/2005 | Stenger et al. |
| 2005/0243527 A1 | | 11/2005 | Jandzio et al. |
| 2009/0153409 A1 | * | 6/2009 | Chiang et al. ................. 343/702 |

FOREIGN PATENT DOCUMENTS

| | | |
|---|---|---|
| EP | 1 592 084 | 11/2005 |
| JP | 57-81704 | 5/1982 |
| TW | 264144 | 12/1991 |

OTHER PUBLICATIONS

Eldek. "Numerical Analysis of a small Ultra Wideband Microstrip-fed tap monopole antenna." *Progress in Electromagnetics Research. PIER.* vol. 65. 2006. pp. 59-69.

* cited by examiner

*Primary Examiner* — Vibol Tan
(74) *Attorney, Agent, or Firm* — Merchant & Gould P.C.

(57) ABSTRACT

A method of forming an antenna by providing a first panel including a first conductive sheet secured to a sheet of dielectric material and forming one or more radiating elements and/or a feed network in the conductive sheet by forming grooves in the conductive sheet. The first panel may be a construction grade building panel or a similar suitable panel. The method enables panel antennas to be manufactured using inexpensive materials using inexpensive manufacturing processes.

26 Claims, 20 Drawing Sheets

PANEL ANTENNA AND METHOD OF FORMING A PANEL ANTENNA

This application is a National Stage Application of PCT/NZ 2008/000171, filed 17 Jul. 2008, which claims benefit of Serial No. 556602, filed 18 Jul. 2007 in New Zealand, and Serial No. 566529, filed 7 Mar. 2008 in New Zealand and which applications are incorporated herein by reference. To the extent appropriate, a claim of priority is made to each of the above disclosed applications.

FIELD OF THE INVENTION

This invention relates to a panel antenna suitable for a wide range of applications including RFID applications and telecommunication applications. The invention also relates to a method of forming a panel antenna and reading RFID tags on conveyors.

BACKGROUND OF THE INVENTION

It is known to make patch antennas where the antenna is constructed from multiple pieces, notably where the ground plane and the patch are separately constructed, and are subsequently fixed together, —see for example TW264144B and US2005146479. These antennas have separate feed networks wherever there is more than one antenna in an array, which further increases the number of components that must be assembled to form a functioning antenna system.

A technique is known in the art (patent U.S. 2005/0243527) for forming RF feed networks on a printed circuit board (PCB) by etching away unused copper, to leave only the required RF feed networks. These feed networks have not been integrated with antennas on the PCB, instead the antennas are separate items that must be suitably connected to the feed network. These feed networks are designed on the basis of removing most of the copper from the PCB, leaving only that copper required to form the RF feed network.

Separately people have made patch antennas where the radiating patch is made from a PCB or similar. These radiating elements have not been integrated with the feed network, nor with the ground plane, but instead have been separately constructed and then suitably assembled and connected. These patch antenna radiating elements are designed on the basis of removing most of the copper from the PCB, leaving only that copper required to form the RF radiating element(s).

RFID readers for conveyor belts only allow antennas to be placed around the conveyor bed and so RFID tags facing the bed may not be read as the article to which the RFID tag is attached may attenuate the signals too much. This makes RFID tags for conveyors unreliable (unless it can be ensured that all items have a desired orientation) and requires operation at high power levels which can cause interference, require shielding and provide erroneous reads from neighbouring equipment.

It would be desirable to provide a panel antenna that is simple and inexpensive to manufacture or to at least provide the public with a useful choice.

Exemplary Embodiments

According to one exemplary embodiment there is provided a method of forming an antenna comprising:
  providing a first panel including a first conductive sheet secured to a sheet of dielectric material; and
  forming one or more radiating elements in the conductive sheet by forming grooves in the conductive sheet.

According to another exemplary embodiment there is provided a panel antenna comprising:

a. a panel formed of dielectric material; and
b. one or more radiating elements formed on a surface of the dielectric material by forming grooves in a first conductive sheet secured to the dielectric material.

According to a further exemplary embodiment there is provided a panel antenna comprising:
  a construction grade building panel including a sheet of dielectric material having a conductive sheet secured thereto in which parts of the conductive sheet have been removed to define radiating elements.

According to another exemplary embodiment there is provided a method of forming an antenna comprising:
  providing a construction grade building panel including a conductive sheet secured to a sheet of dielectric material; and
  forming one or more radiating elements in the conductive sheet by removing portions of the conductive sheet.

According to another exemplary embodiment there is provided a panel antenna for a belt conveyor comprising:

a. a low profile elongate panel antenna having a graduated side profile; and
b. a friction reducing layer on the surface of the panel antenna which, in use, is located adjacent the conveyor belt.

According to another exemplary embodiment there is provided an array of panel antennas for a belt conveyor comprising:

a. a low profile elongate panel antenna having a graduated side profile;
b. a friction reducing layer on the surface of the panel antenna which, in use, is located adjacent the conveyor belt;
c. two low profile elongate panel antennas located on either side of the conveyor belt; and
d. a low profile elongate panel antennas located above the conveyor belt with sufficient height to allow objects to pass underneath.

According to another exemplary embodiment there is provided a belt conveyor comprising:

a. a bed;
b. a belt conveyed upon the bed; and
c. a panel antenna located in a recess within the bed such that the panel antenna is located under the belt.

According to another exemplary embodiment there is provided a belt conveyor comprising:

a. a bed formed of metal having one or more slot formed therein;
b. a belt conveyed upon the bed; and
c. a panel antenna having one or more radiating element, each radiating element being positioned to radiate using one of the one or more slots.

According to another exemplary embodiment there is provided a method of integrating an antenna into a metal bed of a belt conveyor comprising:

a. forming one or more slot in the metal bed; and
b. placing a radiating element under each slot so as to form a slot antenna.

BRIEF DESCRIPTION OF THE DRAWINGS

The accompanying drawings which are incorporated in and constitute part of the specification, illustrate embodiments of the invention and, together with the general description of the invention given above, and the detailed description of embodiments given below, serve to explain the principles of the invention.

DETAILED DESCRIPTION OF EMBODIMENTS OF THE INVENTION

Figure 1:
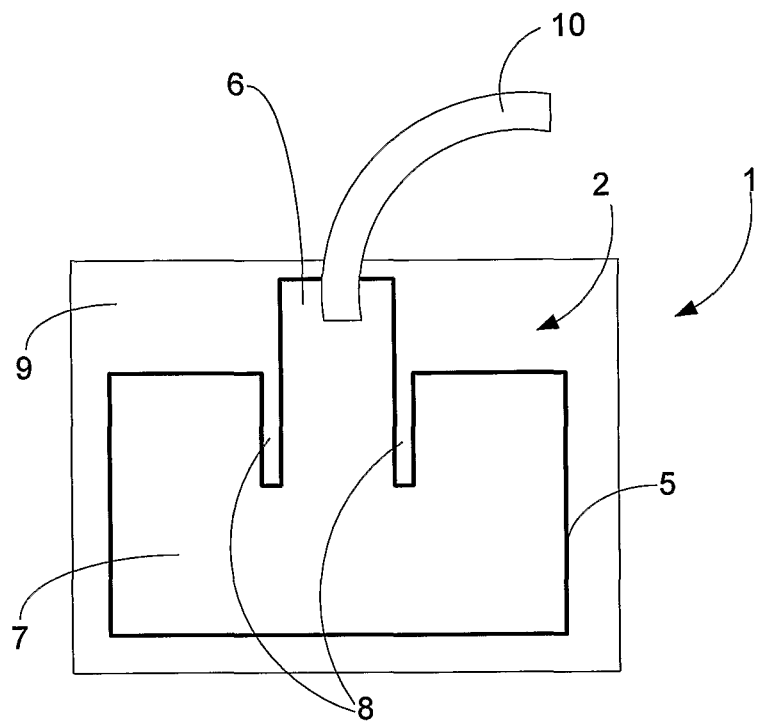
FIG. 1 shows a plan view of a patch antenna formed from a composite panel.
Figure 2:
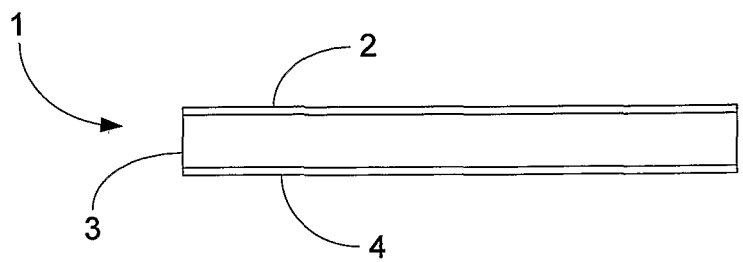
FIG. 2 shows a side view of the panel shown in FIG. 1.

Referring to FIGS. 1 and 2 a method of forming a panel antenna according to the first preferred embodiment will be described. A composite panel 1 consisting of a dielectric layer 3 sandwiched between metal sheets 2 and 4 is provided. A groove 5 is formed in panel 1 resulting in the removal of the portions of conductive sheet 2 located along groove 5. This leaves a feed portion 6 and patch antenna 7 defined within groove 5 with the remaining portion 9 of conductive sheet 2 outside of groove 5. Indented portions 8 may be provided for impedance matching. An RF feed line may be operatively coupled to feed line 6 by capacitive coupling or by forming an electrical connection therebetween.

Whilst panel 1 may be formed of a variety of materials the conductive sheets 2 and 4 may preferably be formed of copper, aluminum or stainless steel. The dielectric material 3 may be formed of polyethylene, polypropylene, PTFE, RT/Duroid 5880, Polystyrene, FR4, ABS (Acrylonitrile butadiene styrene) or similar materials. In a preferred aspect to the invention panel 1 is a mass produced construction grade building panel typically consisting of a polyethylene or polypropylene dielectric sheet 3 sandwiched between copper, aluminum or stainless steel sheets 2 and 4. Such sheets are very inexpensive compared to typical RF materials.

Grooves 5 formed in conductive layer 2 may be formed in a variety of ways including mechanical removal by routing or milling, chemical etching methods etc. This makes manufacture of the antennas very inexpensive utilizing commonly available equipment. The resulting product also has a very low profile.

Figure 3A:
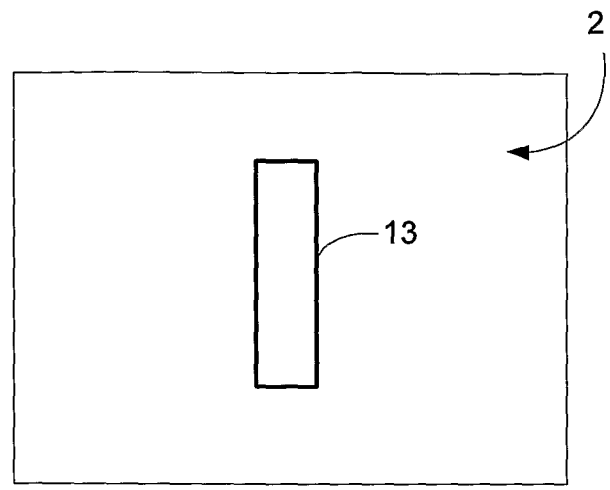
FIG. 3A shows a plan view of a monopole antenna formed from a composite panel.

FIG. 3A shows a monopole antenna formed by forming groove 13 in conductive sheet 2. The ground plane for the monopole has not been shown.

Figure 3B:
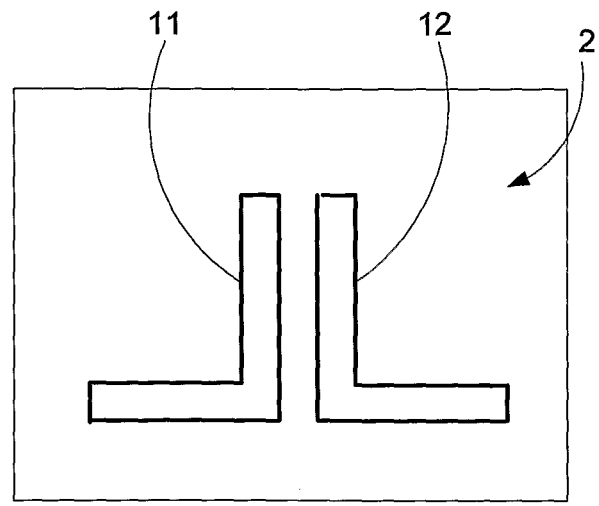
FIG. 3B shows a plan view of a dipole antenna formed from a composite panel.

FIG. 3B shows an alternative embodiment in which a dipole antenna and feed paths is formed in conductive sheet 2 by forming grooves 11 and 12.

Figure 4A:
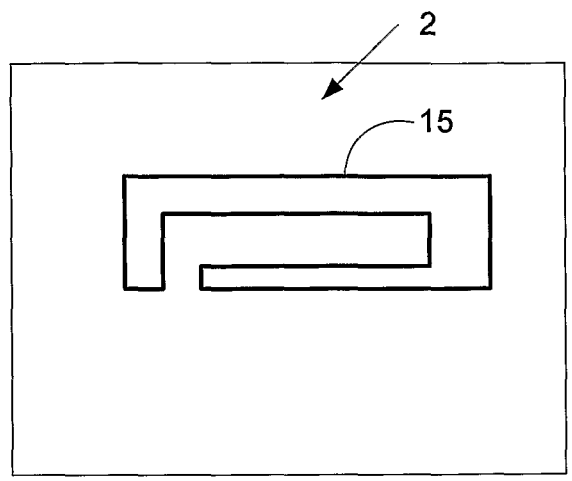
FIG. 4A shows a plan view of a notch antenna formed from a composite panel.

FIG. 4A shows a notch antenna formed by forming groove 15 in conductive sheet 2.

Figure 4B:
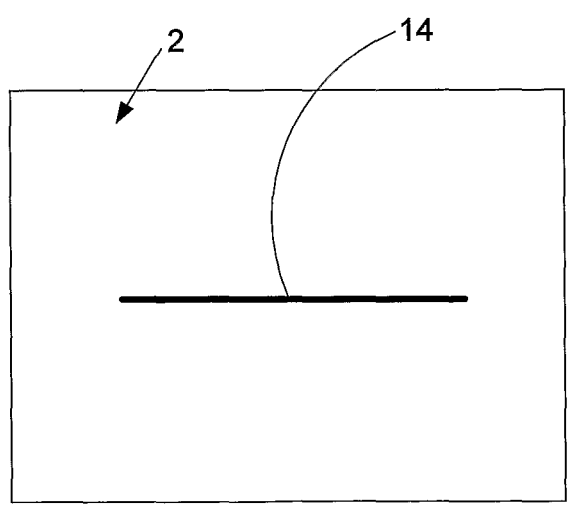
FIG. 4B shows a plan view of a slot antenna formed from a composite panel.

FIG. 4B shows a slot antenna formed by forming groove 14 in conductive sheet 2.

Figure 5:
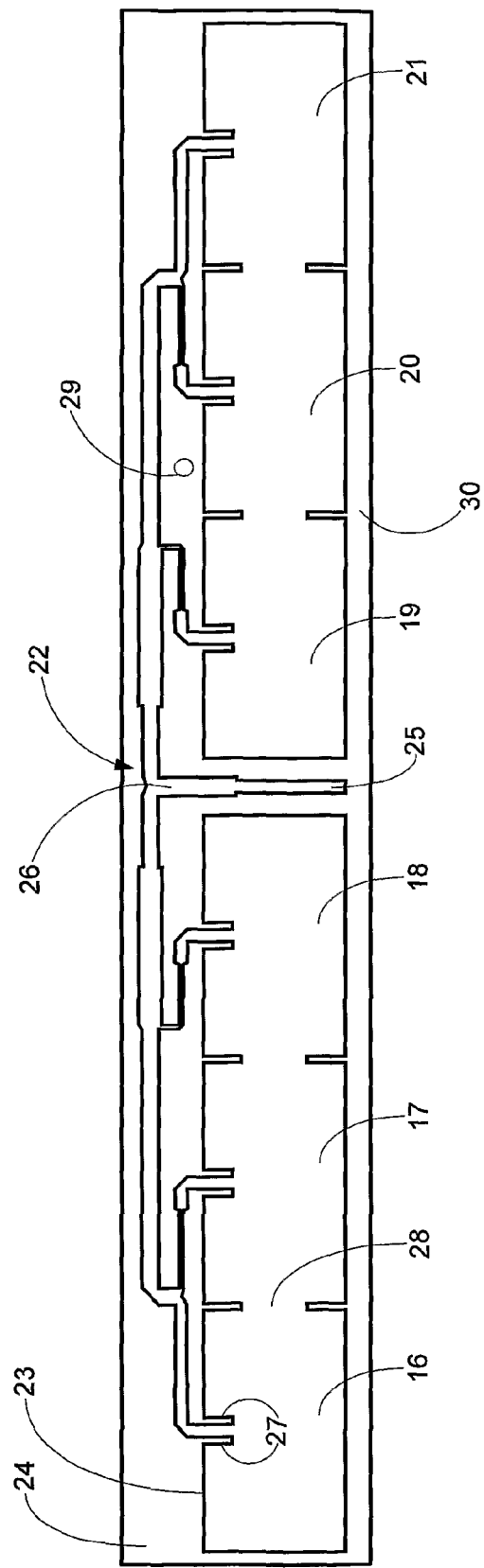
FIG. 5 shows a plan view of an array antenna formed from a composite panel.
Figure 6:
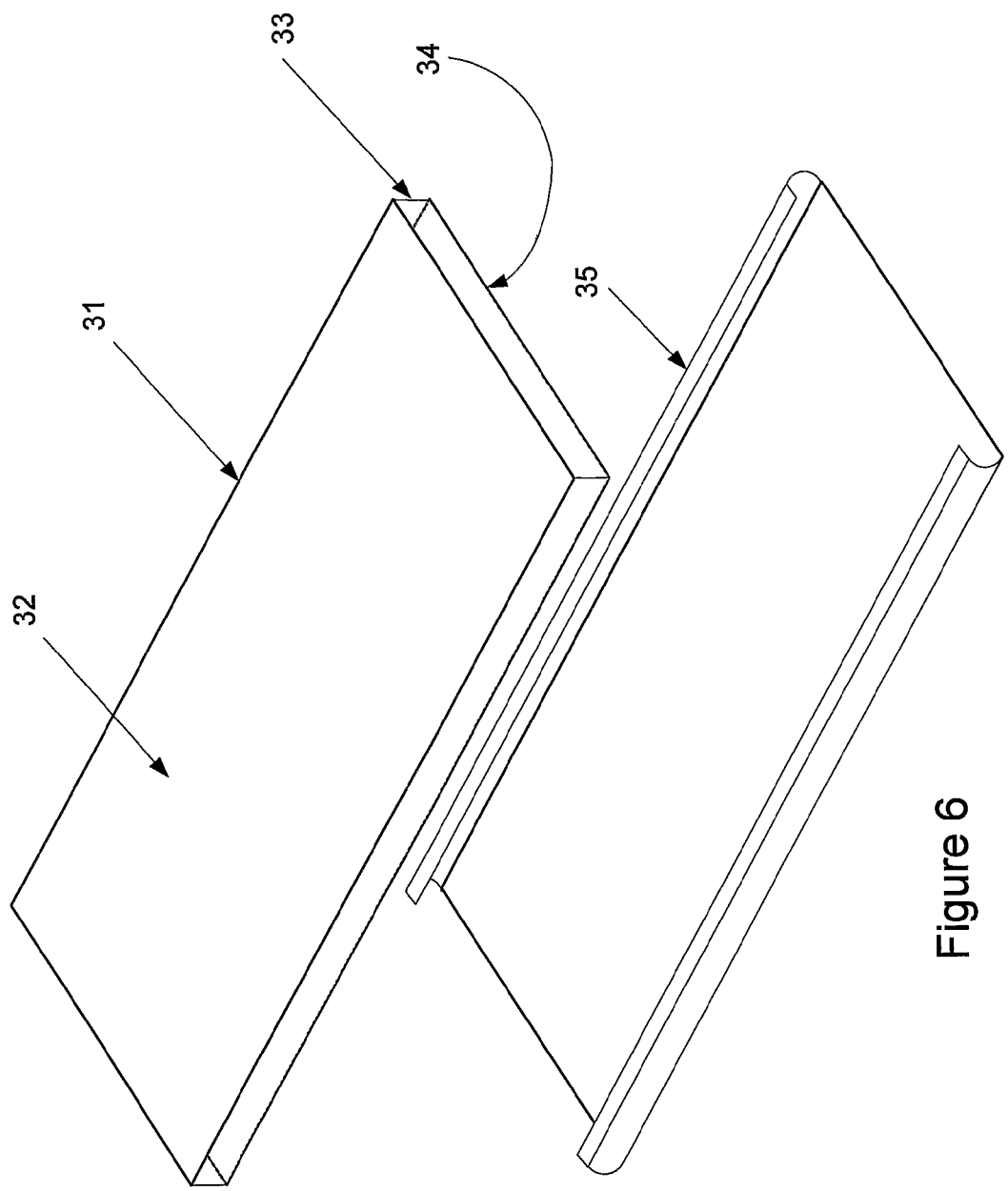
FIG. 6 shows a composite panel being inserted into a metal frame.
Figure 7:
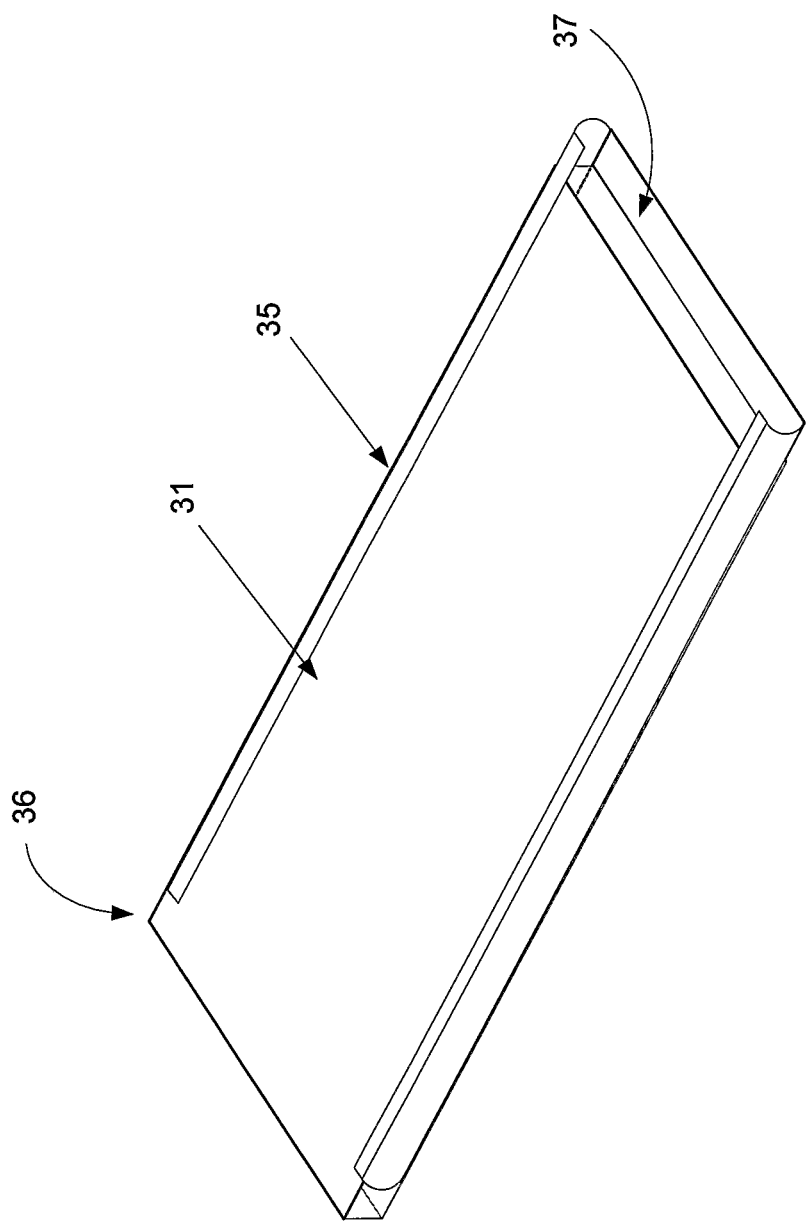
FIG. 7 shows the panel of FIG. 6 mounted within a metal frame.

Referring now to FIG. 5 an antenna array consisting of patch antennas 16 to 21 fed by a feed network 22 is defined by forming grooves 23 in conductive sheet 24. As in the previous example conductive sheet 24 is secured to a dielectric layer below. Preferably a ground plane conductive sheet is secured to the base of the dielectric layer (as per conductive sheet 4 in FIG. 2). Feed point 25 is driven by an RF signal source and divider 26 divides the power into two branches. The widths of the conductors in the feed network are dimensioned so as to provide an appropriate power division between patch antennas, and to provide appropriate impedances. Indents, such as indent 27 in patch 16, are provided to provide impedance matching. Patches are partially conjoined by conductive material, such as indicated at 28, between patches to enhance balancing. This assists in providing equal power division and partial separation between the patches prevents standing waves forming. Various layouts may be used as will be apparent to one skilled in the field including both transmit and receive antenna arrays and feed networks on a single panel.

To avoid inactive portions of conductive sheet 24 (i.e. those portions of conductive sheet 24 not being patches 16-21 or feed network 22) having undesired effects they may be electrically connected to the ground plane. The edges 30 may be connected by conductive elements wrapping around from the top to the bottom of the panel whereas through electrical connections, such us rivets etc. 29 may extend through the panel to provide a conductive path between the ground plane and those parts of conductive sheet 24. Alternatively the inactive portions may be removed (for example by routing or milling). The antenna shown in FIG. 5 may advantageously be formed from a construction grade building panel. Such a panel may have copper or aluminum sheets affixed to a dielectric layer of polyethylene or polypropylene. The dielectric material may have a thickness greater than 3 mm, preferably greater than 4 mm and more preferably about 6 mm.

Figure 8:
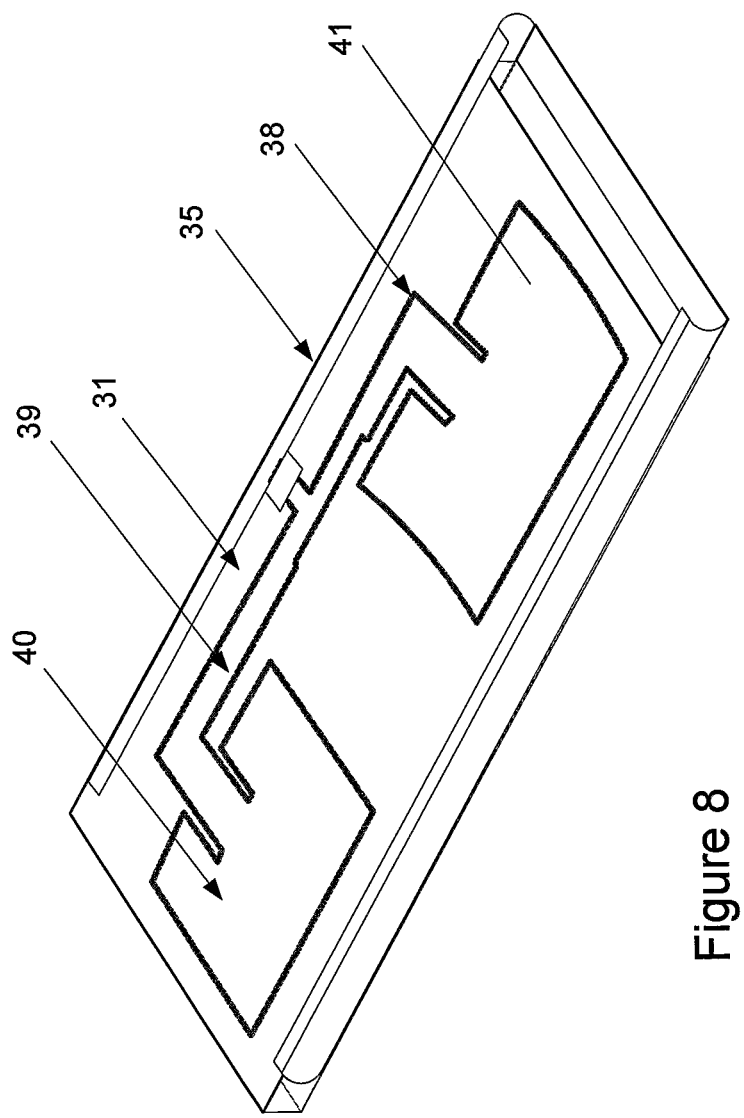
FIG. 8 shows the panel of FIG. 7 with patch radiating elements and a feed network formed therein.
Figure 9:
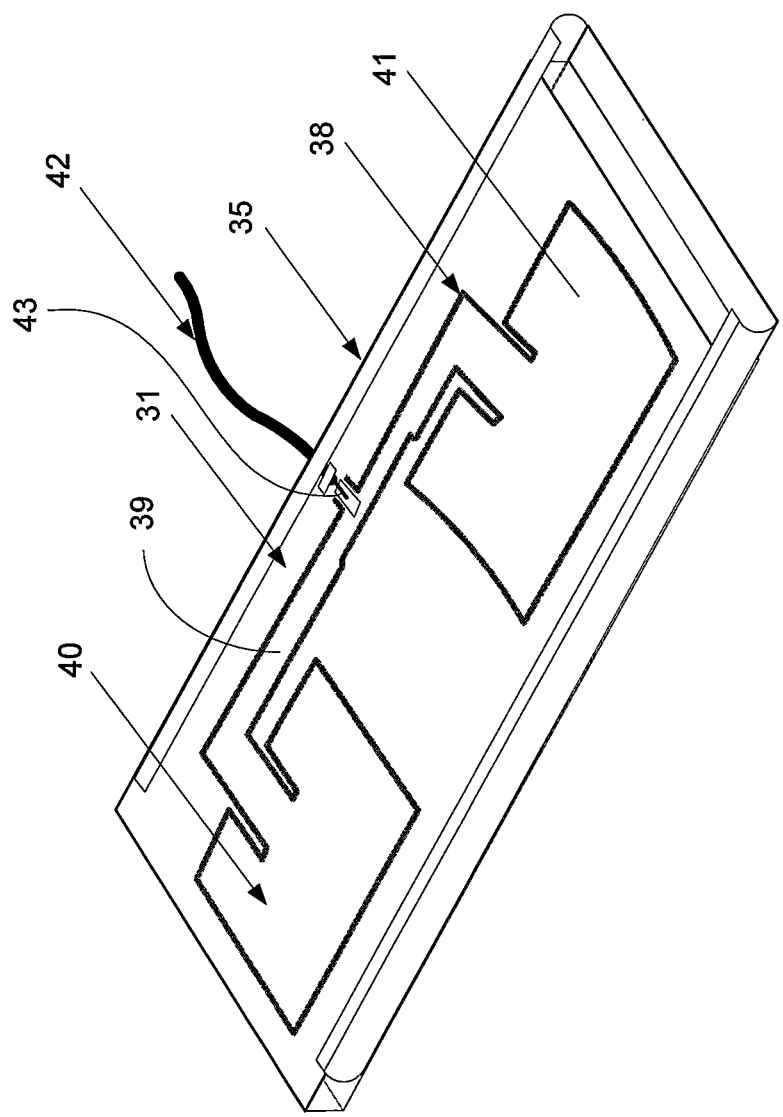
FIG. 9 shows a feed cable connected to the feed network of the panel antenna shown in FIG. 8.
Figure 10:
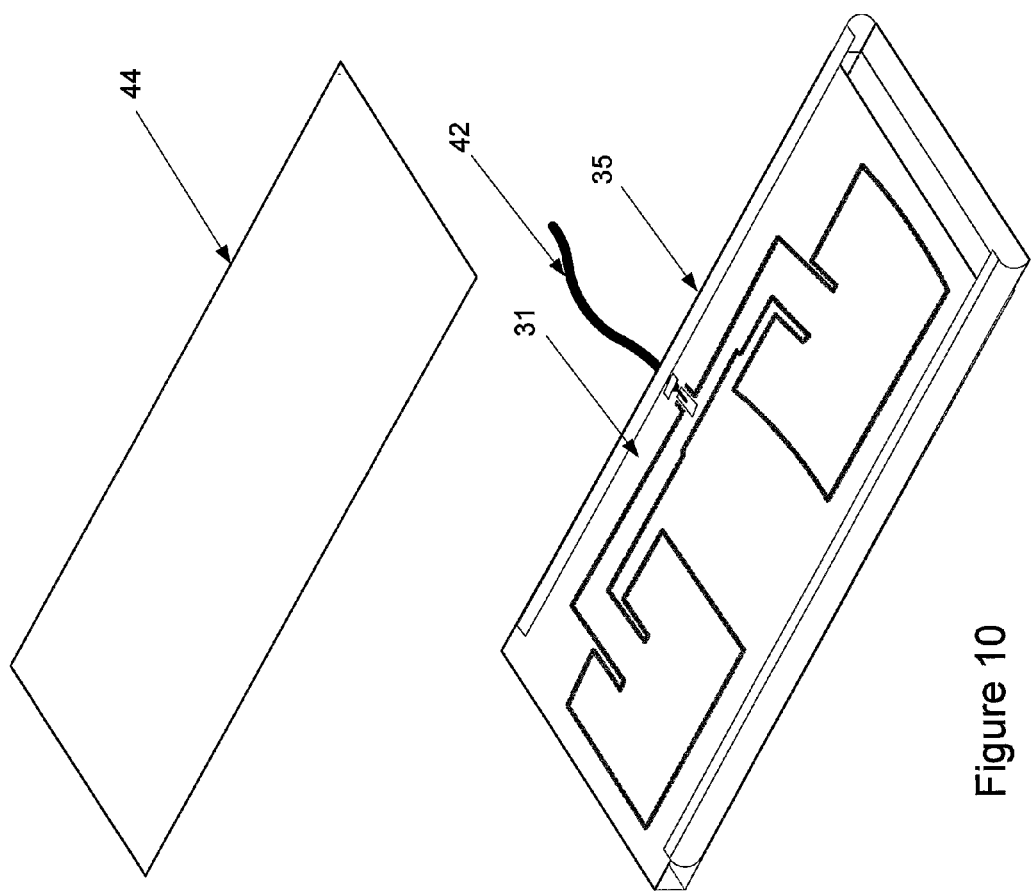
FIG. 10 shows a protective layer being applied to the panel shown in FIG. 9.
Figure 11:
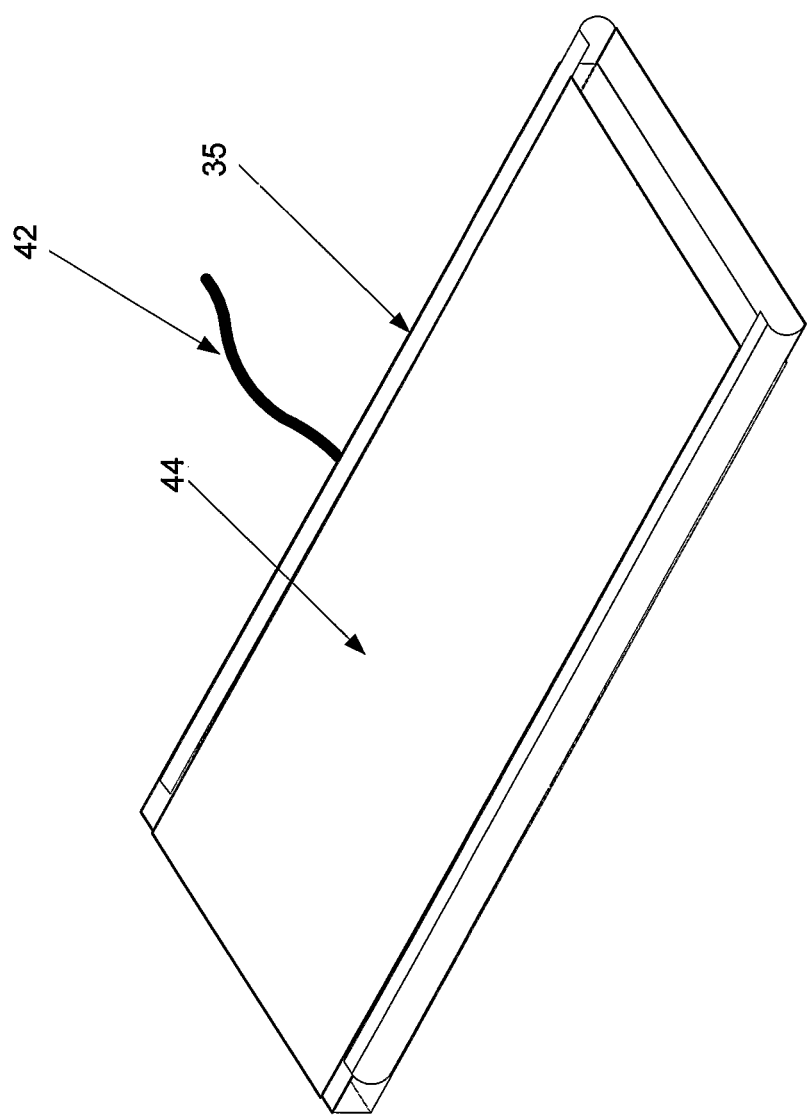
FIG. 11 shows the panel antenna of FIG. 10 with a protective layer applied.
Figure 12:
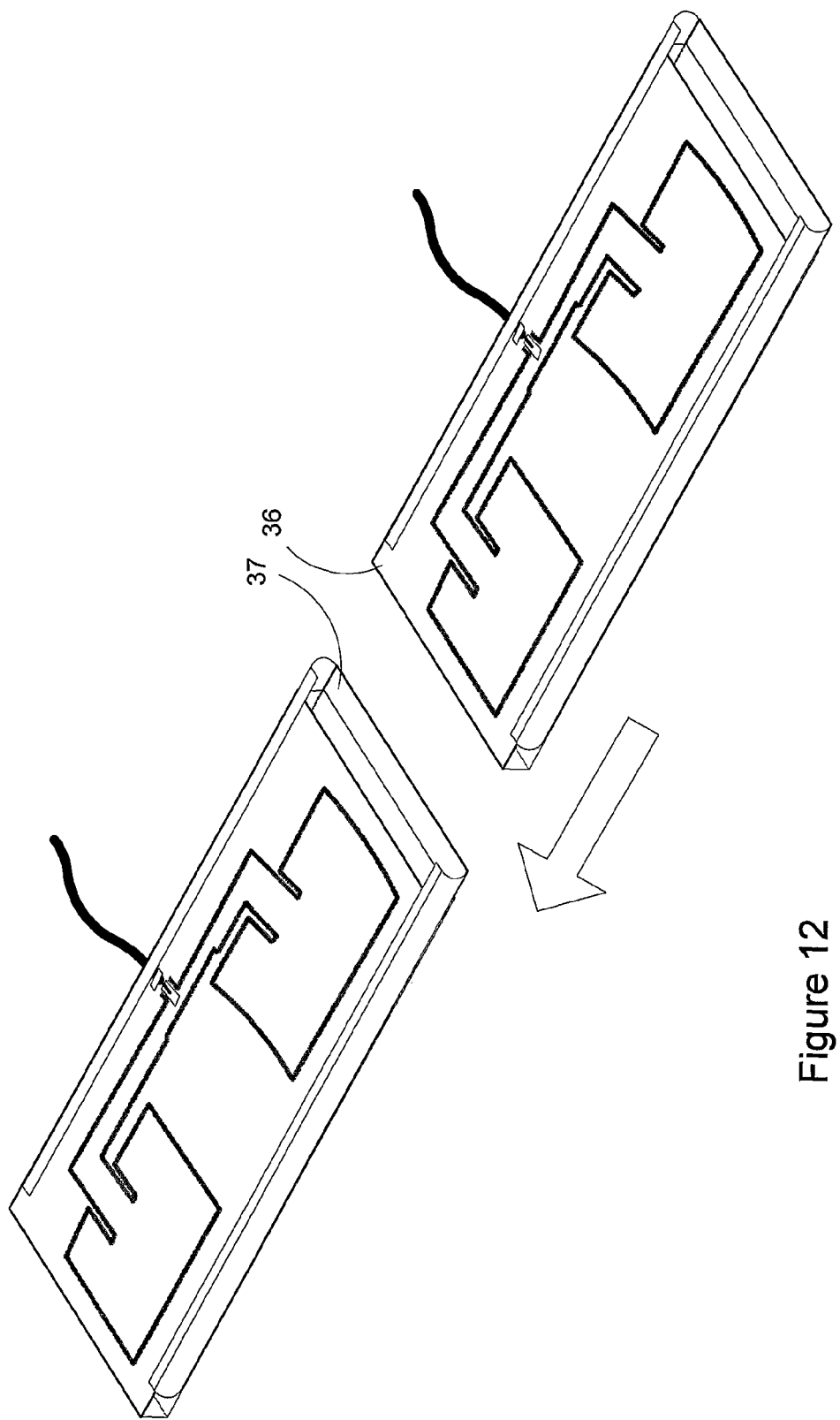
FIG. 12 shows a manner of inter engaging panels.

Referring now to FIGS. 6 to 12 a preferred method for forming and assembling panel antennas as for RFID timing applications is disclosed. A construction grade building panel 31 having a dielectric layer 33 sandwiched between conductive layers 32 and 34 has a metal frame 35 folded around it into the position shown in FIG. 7. The metal frame 35 provides mechanical rigidity and reduces undesired effects caused by inactive portions of the conductive sheet. It will be noted that one end 36 of panel 31 extends beyond frame 35 and at the other end a gap 37 is left. A groove 38 is then mechanically formed in panel 31 by routing, milling etc. to form a feed network 39 and patch elements 40 and 41 as shown in FIG. 8. The groove 38 may optionally be formed prior to the metal frame 35 is folded around panel 31. A feed cable 42 is then connected so that the signal line 43 is capacitively coupled or electrically connected to feed network 39 and the outer conductor is connected to conductive sheet 34. A weatherproof layer 44 is then applied over panel 31 to form a completed unit as shown in FIG. 11 and to reduce environmental tuning/detuning effects. A number of such units may be interconnected as shown in FIG. 12 so that the protruding tongue 36 engages in slot 37 to mechanically secure the panels together. Other fastening techniques may also be used, such as gluing, or using hook and loop fasteners. Any number of like panels may be connected together in this manner to define a continuous panel antenna that may be placed across a start—finish line for RFID timing applications. In such applications the panel antennas may illuminate the start—finish line to activate RFID tags as they cross it.

The feed cable 42 may also be connected from the rear of the panel 31. This arrangement allows the feed point to be positioned away from the edge of the panel 31. In this arrangement the central conductor of the feed cable 42 passes through a hole in the lower conductive layer 4 and the dielectric 3, and is electrically connected to feed network 39 and the outer conductor is connected to the lower conductive sheet 4. The feed cable 42 may also be replaced by a suitably sized connector, where the central pin of the connector passes through a hole in the lower conductive layer 4 and the dielectric 3, and is electrically connected to feed network 39 and the shield or frame of the connector is connected to the lower conductive sheet 4.

Figure 13:
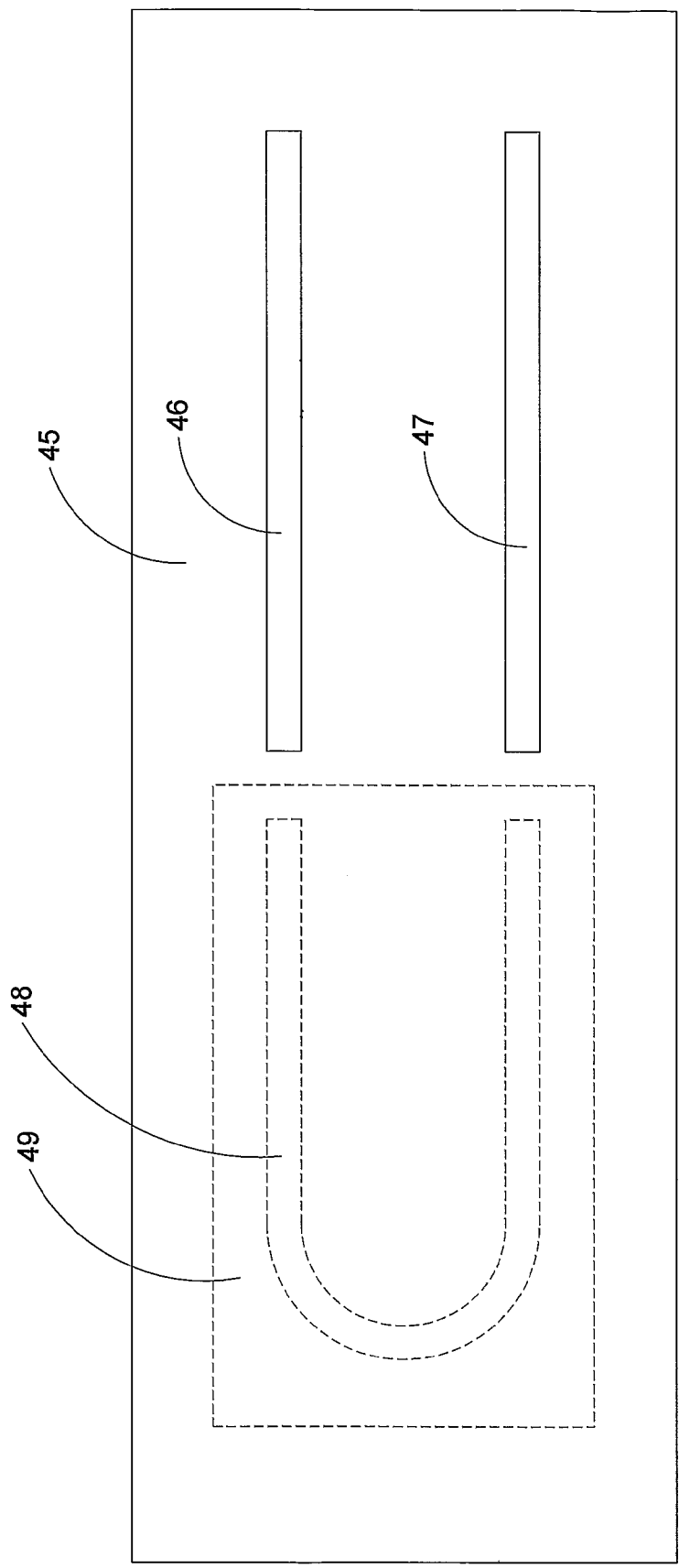
FIG. 13 shows a phase shifter for use in the feed network of a panel antenna.

Referring now to FIG. 13 a phase shifter arrangement suitable for use with the panel antenna shown in FIG. 5 is shown. Two tracks 46 and 47 of a feed network are provided on panel 45 including the feed network and radiating elements (i.e. An arrangement such as show in FIG. 5 simplified to show only a section of the feed network to have a phase shifter inserted). On a separate panel 49 a conductive portion 48 is provided. Conductive portion 48 is placed over tracks 46 and 47 in use so that movement to the right or left relative to panel 45 causes the path length via track 48 to change. This enables a "trombone" type phase shifter to be incorporated into the feed network as shown in FIG. 5. For an array any number of such "trombone" elements 48 may be provided on a single panel 49 and aligned with the main panel 45 so as to enable variable phase shifts to be introduced at various points in the feed network. This may be particularly suitable in telecommunication applications for effecting beam tilt or adjusting beam width. Both panels 45 and 49 may be construction grade building panels although in this case the conductive material surrounding tracks 46 to 48 should be removed to enable proper operation of the phase shifter. Alternatively, the tracks 46 and 47 could be located at the edge of the panel 45. A phase shifter may also be formed by constructing the trombone 48 of a dielectric material, and by connecting conductive tracks 46 and 47.

Figure 14:
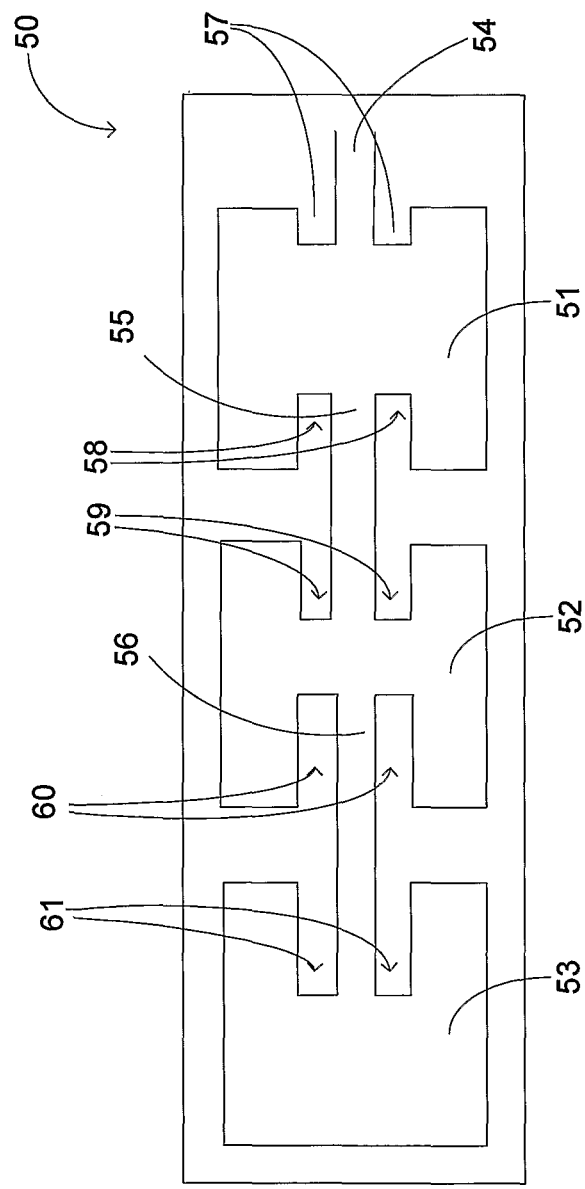
FIG. 14 shows a panel antenna employing a serial feed arrangement.

Referring now to FIG. 14 a panel antenna 50 having a serial feed network is shown. Patch 51 is fed by feed 54 and feeds patch 52 via feed 55, which in turn feeds patch 53 via feed 56. The feed to each successive patch is progressively advanced towards the center of each patch so that the effective impedance of the feed to each patch decreases along the series of patches. It will be seen that the recesses 57 are smaller than recesses 59 which in turn are smaller than recesses 61. Recesses 58 and 59 and recesses 60 and 61 are the same to achieve matching. This arrangement provides equal power distribution to each patch using a simple serial feed arrangement. Instead of varying impedance in this manner the impedance could be varied by using stubs to vary inductance and by varying the geometry of a ground plane to vary capacitance. The inductive and capacitive components could be tuned to the resonant frequency of the antenna.

Figure 15:
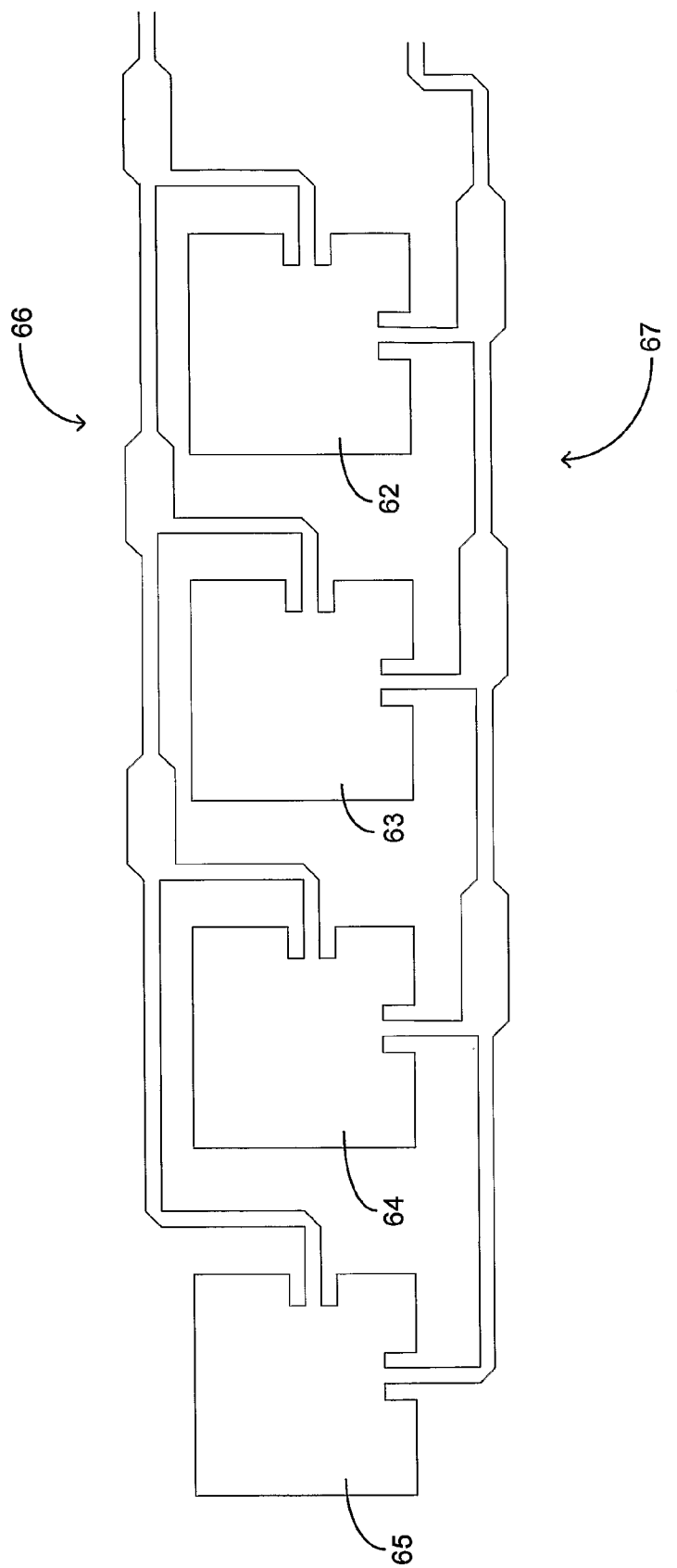
FIG. 15 shows a panel antenna in which the feed network has a branch to feed each radiating element to produce vertically polarised radiation and a branch to feed each radiating element to produce horizontally polarised radiation.

FIG. 15 shows a panel antenna in which radiating elements may be driven with orthogonally polarised radiation. A first branch of the feed network 66 feeds patches 62 to 65 to produce vertically polarised radiation and a second branch of the feed network 67 feeds patches 62 to 65 so as to produce horizontally polarised radiation. In use one branch 66 or 67 may be driven to produce radiation having one polarization, both may be driven to produce circular polarization or the branches may be alternately driven. Operation may be determined by hard wiring at installation or by driving logic driving the respective branches. Alternative polarizations can also be achieved with different routing geometries, for example the patches could by oriented at 45 degrees to achieve diagonal polarisation.

Figure 16:
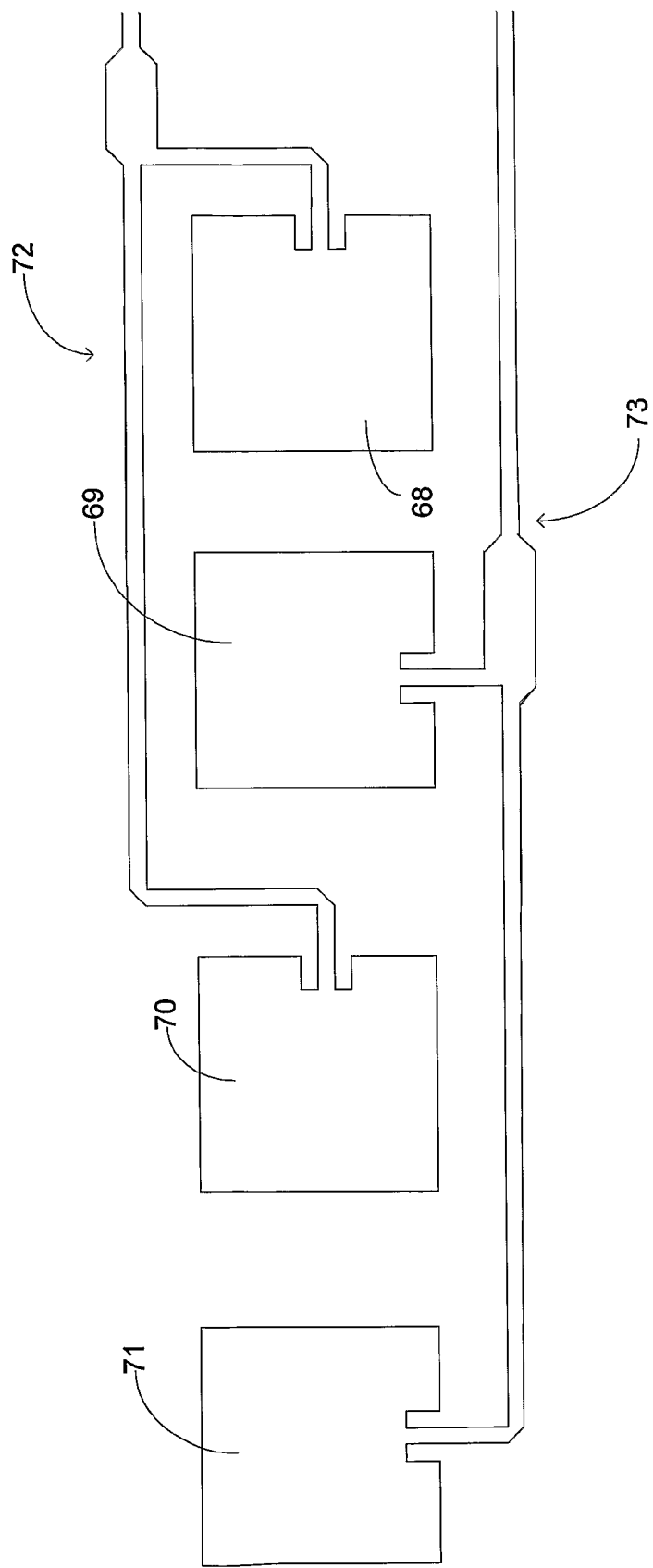
FIG. 16 shows a panel antenna having radiating elements producing radiation having alternating polarisation.

FIG. 16 shows a panel antenna in which a first branch of the feed network 72 feeds patches 68 and 70 so as to produce vertically polarised radiation and a second branch of the feed network 73 drives pitches 69 and 71 so as to produce horizontally polarised radiation.

Whilst the panel antennas shown in FIGS. 14 to 16 may be used in a wide range of applications they are suitable for use in RFID applications including monitoring items on conveyors.

Figure 17:
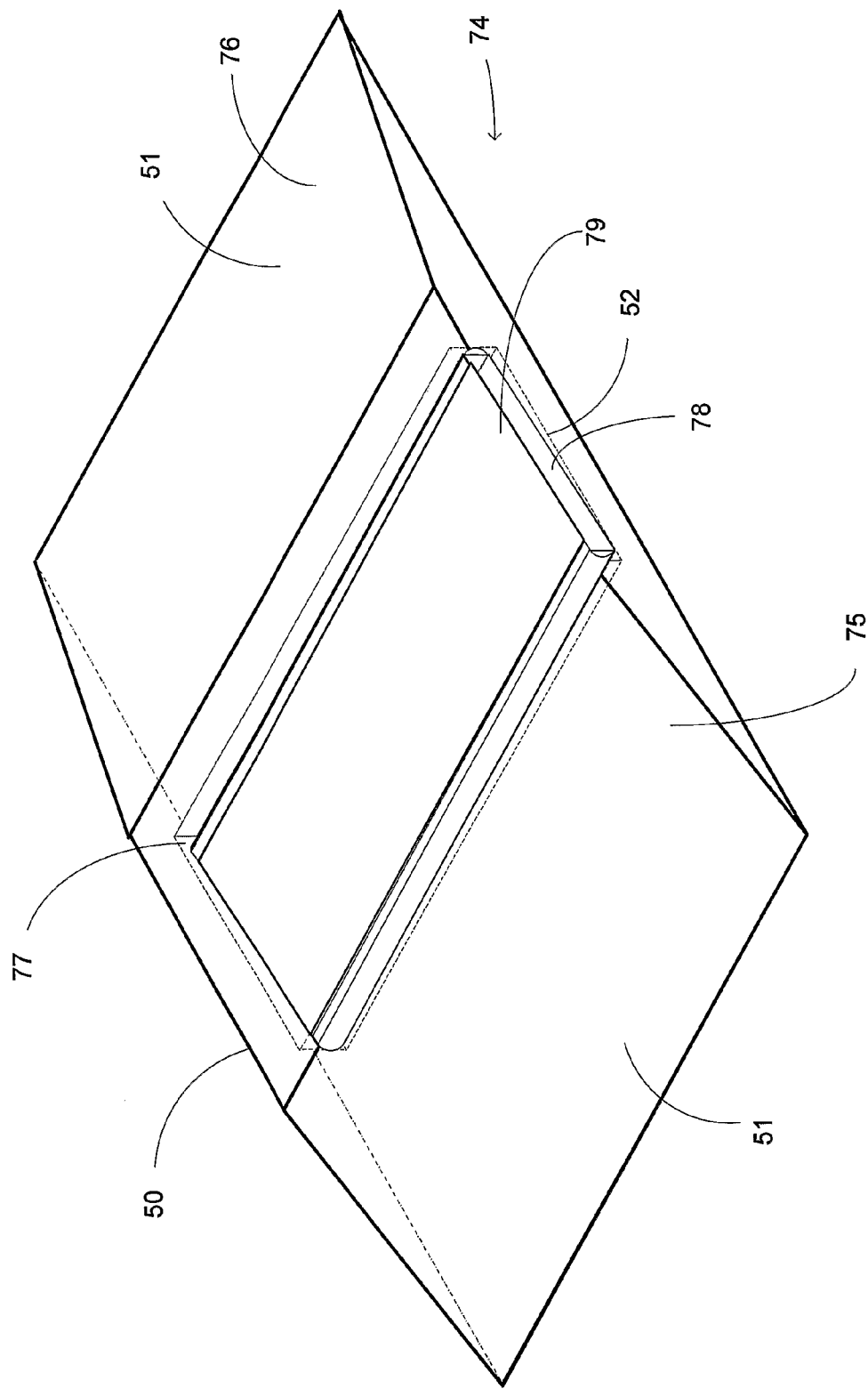
FIG. 17 shows a panel antenna to be deployed under the belt of a conveyor.

FIG. 17 shows a panel antenna adapted to be placed under the belt of a conveyor belt to enable the reading of RFID tags. Body 74 has ramped portions 75 and 76 to provide a gradual transition as the belt passes over the panel antenna. A recess 77 is provided to accommodate panel antenna 78 (which could be any of the panel antennas as shown in FIGS. 14 to 16). Body 74 is preferably formed of a material having a low friction coefficient and panel antenna 78 is preferably coated with a material having a low friction coefficient which is relatively transparent to ultra high radio frequency radiation, such as Ultra-High Molecular Weight Polyethylene (UHMWPE).

A panel antenna of the type shown in FIG. 17 may simply be placed between the bed of a belt conveyor and the conveyor belt so that it may be easily retrofitted to existing conveyor belts. The total thickness of the assembly is preferably less than 15 mm, and more preferably less than 10 mm. By providing a panel antenna underneath the belt as well as antennas surrounding the belt reliable reading of RFID tags may be achieved. Using this technique reliable RFID readers may be easily retrofitted to existing conveyor belts.

Figure 18:
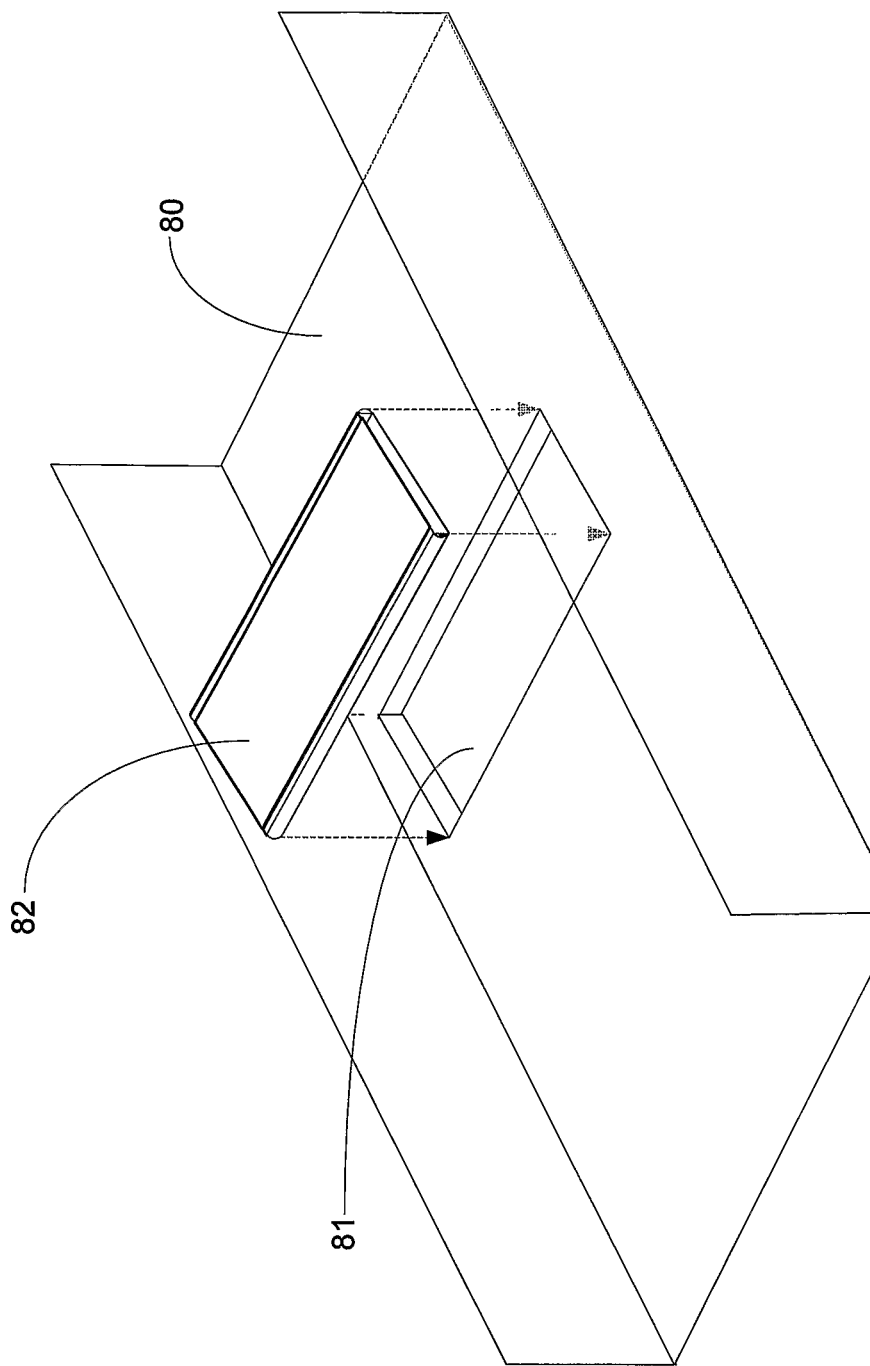
FIG. 18 shows a panel antenna located in a recess in the bed of a conveyor.

FIG. 18 shows a conveyor in which a panel antenna 82 is located within a recess 81 of conveyor bed 80. The panel antenna 82 is preferably coated with the material having a low friction coefficient which is relatively transparent to ultra high radio frequency radiation, such as Ultra-High Molecular Weight Polyethylene (UHMWPE). This arrangement allows the conveyor belt to move over the conveyor bed without any disruption to its path.

Figure 19:
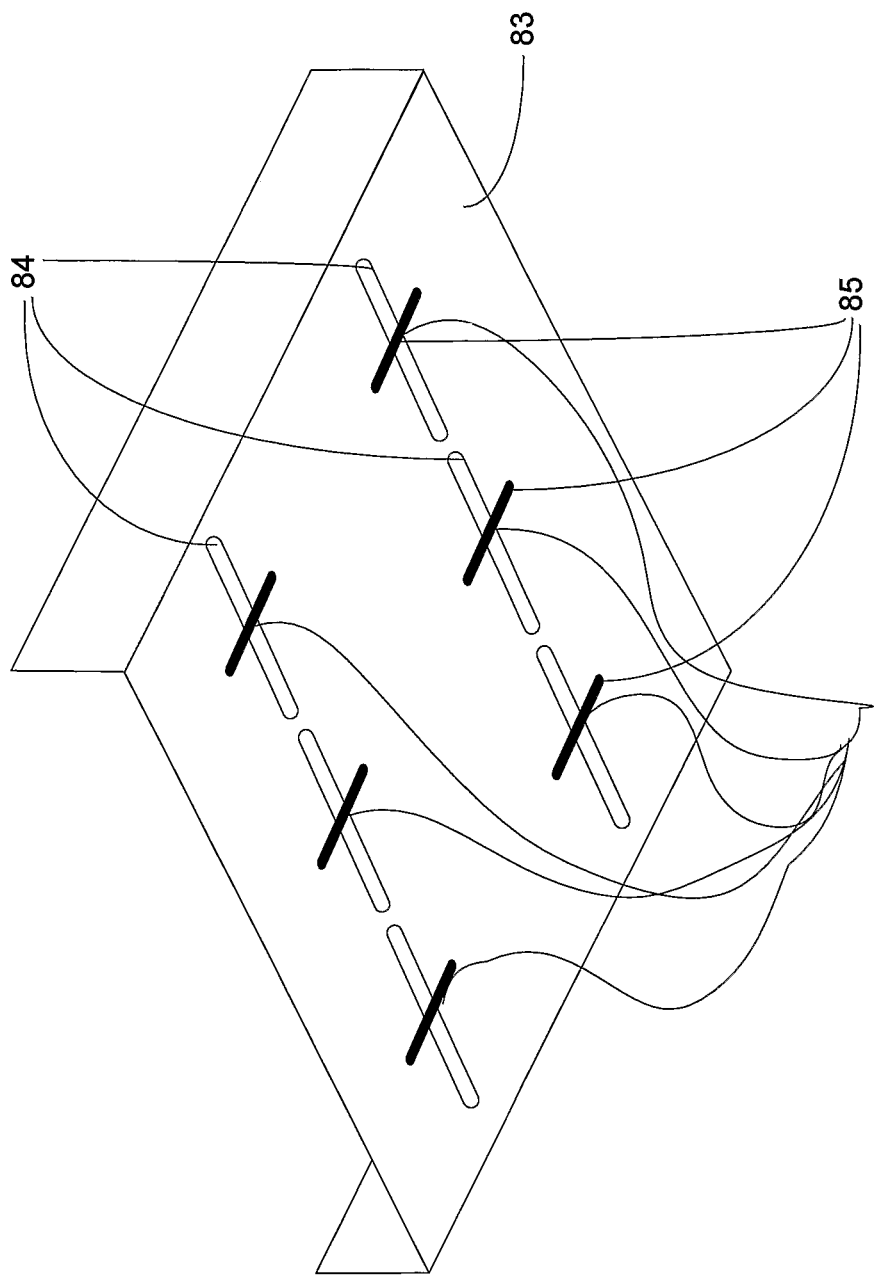
FIG. 19 shows a method of creating slot antennas in the bed of a conveyor.

FIG. 19 shows the underside of a conveyor bed according to another embodiment. This design may be used when constructing a new conveyor bed or to retrofit an existing conveyor bed. A plurality of slots 84 are formed in the sheet metal base of bed 83. Radiating elements 85 are located on the underside of the conveyor bed proximate the slots. Radiating elements 85 may be in the form of a panel antenna or individual elements. The slots may be filled with a dielectric material.

Figure 20:
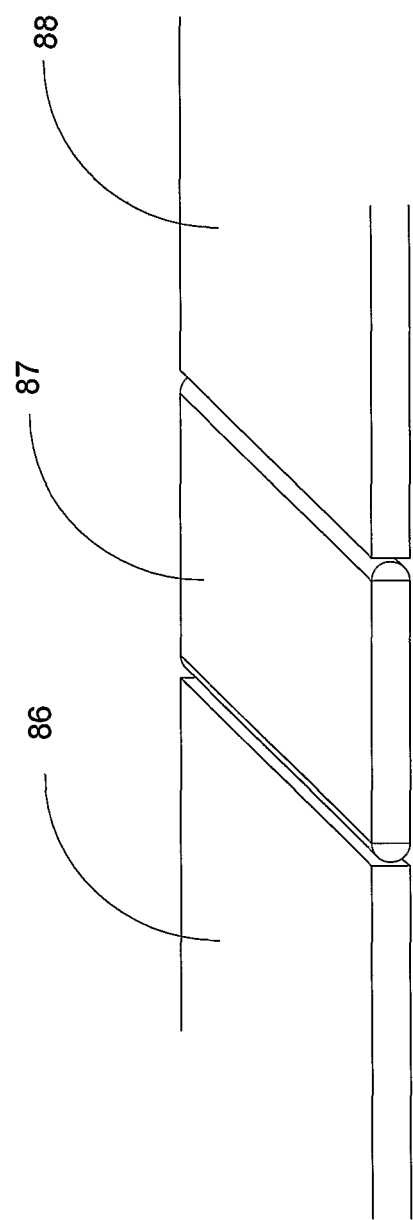
FIG. 20 shows the installation of a panel antenna in the bed of a conveyor.

FIG. 20 shows an embodiment in which a panel antenna 87 is provided as a bridge between two conveyor belts 86 and 88. In this way an RFID tag can be read at the point one conveyor transfers its items to another conveyor.

Figure 21:
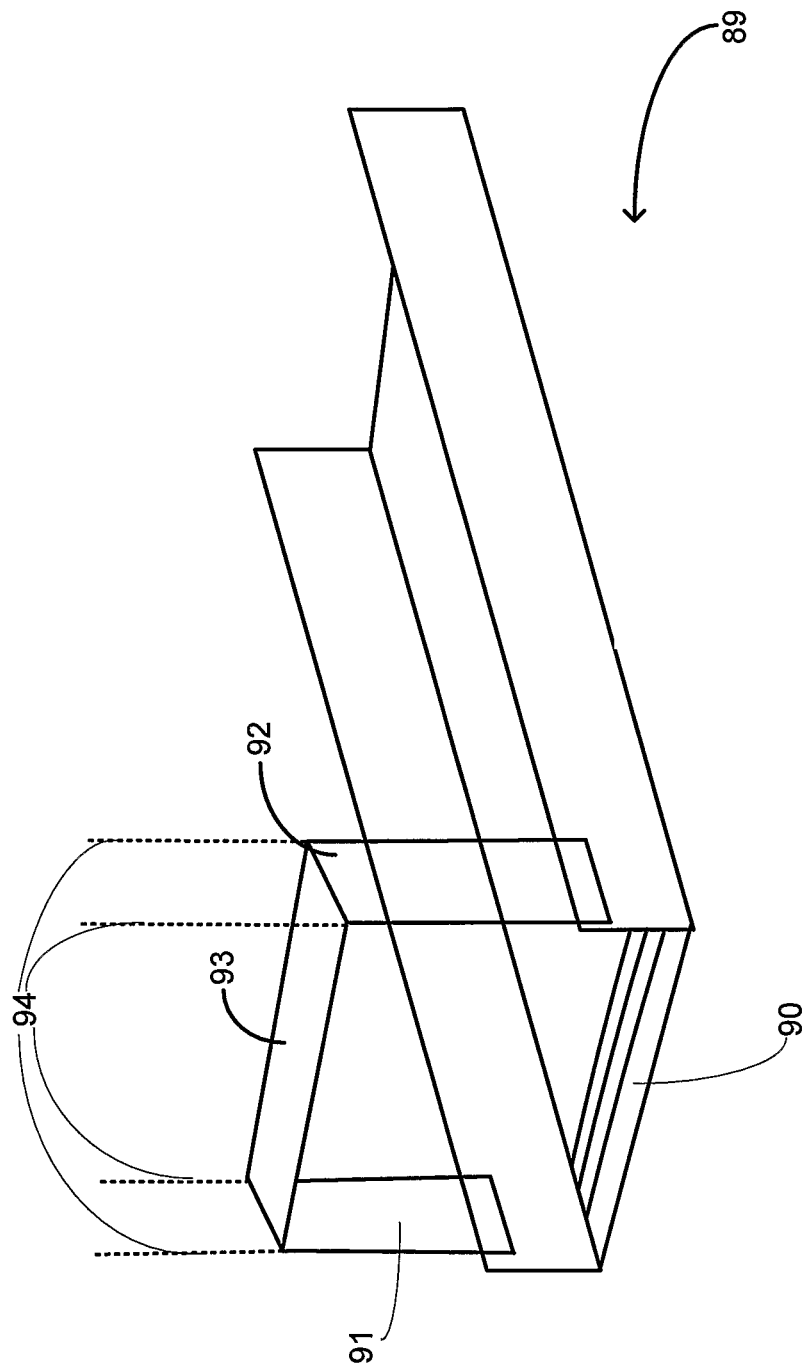
FIG. 21 shows an RFID reading system around a conveyor belt.

FIG. 21 shows a conveyor 89 including a lower panel antenna 90 (of the form shown in FIG. 17), side panel antennas 91 and 92 and a top panel antenna 93. Panel antennas 91, 92 and 93 are suspended by wires 94 so that if an item on the conveyor hits a panel antenna it can simply sway out of the way.

Such an arrangement allows RFID tags being conveyed to be read from all directions, reducing the required power of transmitted radiation and greatly improving read reliability. Reduced power reduces interference with neighbouring systems and misreads from nearby readers.

It will be appreciated that panel antennas could be fixedly secured to surround a conveyor belt or be provided within an X-ray machine etc.

The panel antennas are preferably operated in the ultra high frequency range and have been effectively deployed operating at 920 to 926 MHz. The antennas should preferably be driven so as to avoid opposing antennas being on at the same time and to avoid nulls. The drive strategy employed should provide good coverage of all possible tag positions and tag orientations. This may include switching the panel antennas being driven or scanning the read space with the antenna beam.

The method of manufacture described allows antennas to be constructed from inexpensive panels, such as are produced for the building industry using inexpensive manufacturing techniques. By simultaneously forming the radiating elements and feed network in one manufacturing step production is simplified and labour costs are reduced. Panels produced are robust, rigid, have a low profile and can easily be incorporated into building structures. Series of panels can be joined together end to end to provide a long panel suitable for timing applications.

Conveyor belts incorporating a panel antenna to read from underneath the belt provide accurate RFID tag reading in all directions and allow the RFID reader to operate at lower power levels without requiring shielding.

While the present invention has been illustrated by the description of the embodiments thereof, and while the embodiments have been described in detail, it is not the intention of the Applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departure from the spirit or scope of the Applicant's general inventive concept.

The invention claimed is:

1. A method of forming an antenna comprising:
   a. providing a first panel including a first conductive sheet secured to a sheet of dielectric material;
   b. forming an array of radiating elements in the conductive sheet by forming grooves in the conductive sheet; and
   c. forming a feed network to the radiating elements by forming grooves in the conductive sheet to feed the radiating elements, wherein the feed network is formed to:
      i. feed one or more of the radiating elements so as to produce radiation having a first polarization; and
      ii. produce radiation having a second polarization substantially orthogonal to the first polarization.

2. A method as claimed in claim 1 wherein the effective impedance of the feed to each radiating element decreases towards the end of the array.

3. A method as claimed in claim 1 wherein one branch of the feed network is formed to feed one or more particular radiating elements of the one or more radiating elements so as to produce radiation having the first polarization and a second branch of the feed network is formed to feed the one or more particular radiating elements so as to produce radiation having the second polarization substantially orthogonal to the first polarization.

4. A method as claimed in claim 3 wherein the first polarization is horizontal and the second polarization is vertical.

5. A method as claimed in claim 1 wherein one branch of the feed network is formed to feed one or more particular radiating elements of the one or more radiating elements so as to produce radiation having the first polarization and a second branch of the feed network is formed to feed one or more other radiating elements of the one or more radiating elements so as to produce radiation having the second polarization substantially orthogonal to the first polarization.

6. A method as claimed in claim 5 wherein the first polarization is horizontal and the second polarization is vertical.

7. A method as claimed in claim 1 wherein feeds to at least one of the one or more radiating elements are formed by grooves extending within the perimeter of the radiating element to provide impedance matching.

8. A method as claimed in claim 1 wherein the feed network includes coupling elements configured to form variable phase shifters in conjunction with complementary coupling elements.

9. A method as claimed in claim 1 wherein a plurality of patch antennas are provided side by side in an array with adjacent patch antennas being partially conjoined by conductive material of the first conductive sheet.

10. A panel antenna comprising:
    a. a panel formed of dielectric material;
    b. an array of radiating elements formed on a surface of the dielectric material by forming grooves in a first conductive sheet secured to the dielectric material; and
    c. a feed network for feeding the radiating elements formed by forming grooves in the first conductive sheet wherein:
       i. the feed network feeds one or more of the radiating elements so as to produce radiation having a first polarization; and
       ii. the panel antenna produces radiation having a second polarization substantially orthogonal to the first polarization.

11. A panel antenna as claimed in claim 10 wherein the effective impedance of the feed path to each radiating element decreases towards the end of the array.

12. A panel antenna as claimed in claim 10 wherein one branch of the feed network feeds one or more particular radiating elements of the one or more radiating elements so as to produce radiation having the first polarization and a second branch of the feed network feeds the one or more particular radiating elements so as to produce radiation having the second polarization substantially orthogonal to the first polarization.

13. A panel antenna as claimed in claim 12 wherein the first polarization is horizontal and the second polarization is vertical.

14. A panel antenna as claimed in claim 10 wherein one branch of the feed network feeds one or more particular radiating elements of the one or more radiating elements so as to produce radiation having the first polarization and a second branch of the feed network feeds one or more other radiating elements of the one or more radiating elements so as to produce radiation having the second polarization substantially orthogonal to the first polarization.

15. A panel antenna as claimed in claim 14 wherein the first polarization is horizontal and the second polarization is vertical.

16. A panel antenna as claimed in claim 14 wherein each branch of the feed network feeds two elements.

17. A panel antenna as claimed in claim 10 wherein feeds to at least one of the one or more radiating elements are formed by grooves extending within the perimeter of each radiating element to provide impedance matching.

18. A panel antenna as claimed in claim 17 wherein the radiating elements are fed in series with each successive feed to a subsequent radiating element being formed by grooves extending further within the perimeter of the subsequent radiating element than for the preceding radiating element.

19. A panel antenna as claimed in claim 10 wherein the feed network includes coupling elements configured to form variable phase shifters in conjunction with complementary coupling elements.

20. A panel antenna as claimed in claim 10 wherein a plurality of patch antennas are provided side by side in an array with adjacent patch antennas being partially conjoined by conductive material of the first conductive sheet.

21. A panel antenna as claimed in claim 10 wherein the dielectric material is selected from: polyethylene, polypropylene, PTFE, a fiberglass epoxy resin composite, Polystyrene and Acrylonitrile butadiene styrene.

22. A panel antenna as claimed in claim 10 wherein the dielectric material has a thickness greater than 3 mm.

23. A method of forming an antenna comprising:
   a. providing a construction grade building panel including a first conductive sheet secured to a sheet of dielectric material;
   b. forming an array of radiating elements in the conductive sheet by forming grooves in the conductive sheet; and
   c. forming a feed network to the radiating elements by forming grooves in the conductive sheet to feed the radiating elements in series.

24. A panel antenna comprising:
   a. a panel formed of dielectric material;
   b. an array of radiating elements formed on a surface of the dielectric material by forming grooves in a first conductive sheet secured to the dielectric material; and
   c. a feed network for feeding the radiating elements in series formed by forming grooves in the first conductive sheet, wherein the panel is a construction grade building panel.

25. A method as claimed in claim 1 wherein the radiating elements are fed in series.

26. A panel as claimed in claim 10 wherein the radiating elements are fed in series.

* * * * *